(12) United States Patent
Kobayashi et al.

(10) Patent No.: US 6,486,414 B2
(45) Date of Patent: Nov. 26, 2002

(54) THROUGH-HOLE STRUCTURE AND PRINTED CIRCUIT BOARD INCLUDING THE THROUGH-HOLE STRUCTURE

(75) Inventors: Kaoru Kobayashi, Kusatsu (JP);
Hiroyuki Mori, Shiga-ken (JP);
Kimihiro Yamanaka, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/921,245

(22) Filed: Aug. 1, 2001

(65) Prior Publication Data

US 2002/0027020 A1 Mar. 7, 2002

(30) Foreign Application Priority Data

Sep. 7, 2000 (JP) ......................... 2000-271251

(51) Int. Cl.[7] ........................... H05K 1/11; H01R 12/04
(52) U.S. Cl. ................. 174/261; 174/255; 174/262; 174/264; 174/265; 174/266; 361/785; 361/794; 361/795; 439/65
(58) Field of Search ................ 174/261, 255, 174/260, 262, 266, 265, 263, 264, 258, 256, 250; 361/733, 746, 760, 780, 785, 789, 792, 794, 795, 803, 807; 439/607, 63, 79, 65, 541.5, 66

(56) References Cited

U.S. PATENT DOCUMENTS

| | | | | |
|---|---|---|---|---|
| 5,036,301 A | * | 7/1991 | Takao et al. .................. 333/185 |
| 5,157,477 A | * | 10/1992 | Chance ......................... 257/758 |
| 5,293,502 A | * | 3/1994 | Kimura et al. ............... 174/250 |
| 5,319,159 A | * | 6/1994 | Watanabe et al. ........... 174/262 |
| 5,326,937 A | * | 7/1994 | Watanabe .................... 174/263 |
| 5,331,514 A | * | 7/1994 | Kuroda ........................ 361/760 |
| 5,363,280 A | * | 11/1994 | Chobot et al. .............. 361/794 |
| 5,487,218 A | * | 1/1996 | Bhatt et al. ................... 29/852 |
| 5,538,433 A | * | 7/1996 | Arisaka ........................ 439/70 |
| 5,944,563 A | * | 8/1999 | Nagafuji ...................... 439/751 |
| 6,195,883 B1 | * | 3/2001 | Bhatt et al. ................... 29/852 |
| 6,259,039 B1 | * | 7/2001 | Chroneos, Jr. et al. ..... 174/263 |

FOREIGN PATENT DOCUMENTS

| | | | |
|---|---|---|---|
| DE | 0243021 A1 | * | 4/1987 |
| JP | 02000216510 A | * | 8/2000 |

* cited by examiner

*Primary Examiner*—David L. Talbott
*Assistant Examiner*—J B Patel
(74) *Attorney, Agent, or Firm*—Scully, Scott, Murphy & Presser; Lawrence R. Fraley, Esq.

(57) ABSTRACT

The present invention provides a through-hole structure for connecting a connector to a printed circuit board, the through-hole structure comprising a signal through-hole having a conductive layer therein for supplying a signal to the printed circuit board, power through-holes having a conductive layer therein for supplying power to the printed circuit board, and dielectric constant adjusting portions formed among the signal through-hole and the power through-holes. Moreover, the present invention provides a printed circuit board having the above-described through-hole structure formed therein.

30 Claims, 8 Drawing Sheets

THROUGH-HOLE STRUCTURE AND PRINTED CIRCUIT BOARD INCLUDING THE THROUGH-HOLE STRUCTURE

FIELD OF THE INVENTION

The present invention relates to a printed circuit board, more specifically to a through-hole structure positioned in the printed circuit board for connecting a high-frequency connector to the printed circuit board.

BACKGROUND OF THE INVENTION

In some cases, a connector is mounted directly onto a printed circuit board for various purposes such as signal input from an external device and as power supply to the printed circuit board. In such a case, as the frequency of the signal from the external device becomes higher, a problem of impedance mismatch may occur. Such impedance mismatch lowers integrity of the signal, or in some cases, makes it impossible for the signal to transmit. Accordingly, it is necessary that any impedance mismatch between a connection portion of the printed circuit board and the connector, particularly at high-frequency, be substantially eliminated.

Heretofore, impedance matching has been performed by providing through-hole conductors around a signal through hole, where the through-hole conductors are extending parallel to the signal through hole side walls. Since the through-hole conductors are arranged in the vicinity of a signal path and the distance between the through holes can be small, electrostatic capacitance in the signal path exists. Such existence of electrostatic capacitance in the signal path directly results in an increase of stray capacitance. When a high-frequency connector is connected to the connector portion of the printed circuit board to supply the signal thereto, through-hole conductors arranged around a signal through-hole become less effective at controlling impedance mismatching. Moreover, demand for high density packaging on the printed circuit board has increased more and more in recent years. Therefore, in many cases, a power supply circuit conductor is also provided in the vicinity of the through hole for transmitting a high-frequency signal therethrough. A through-hole structure and a printed circuit board, which are capable of adjusting the impedance in the connection portion of the board having a high-frequency connector connected thereto, have been required.

It is believed that a through-hole structure in a connection portion of a printed circuit board, which does not increase stray capacitance due to the increase of the electrostatic capacitance in the signal path, and is capable of readily and effectively adjusting the impedance in the connection portion of the printed circuit board when a high-frequency connector is utilized to transmit a high-frequency signal therethrough, would represent a significant advancement in the art.

SUMMARY OF THE INVENTION

Accordingly, it is the object of this invention to provide a new and unique through-hole structure.

Another object of this invention is to provide a through-hole structure as part of a connection portion of a printed circuit board.

The invention significantly reduces interference and noise in the connection portion of a printed circuit board when the connection portion is connected to a high frequency connector.

According to one aspect of the invention, there is provided a through-hole structure comprising a dielectric substrate having a connector portion therein, the connector portion having a dielectric constant, a first through-hole positioned in the connector portion of the dielectric substrate, the first through-hole including a conductive layer therein for supplying a signal to the through-hole structure, a second through-hole positioned in the connector portion of the dielectric substrate relative to the first through-hole, the second through-hole including the conductive layer therein for supplying electrical power to the through-hole structure, and at least one dielectric constant adjusting portion positioned in the connector portion of the dielectric substrate relative to the first and second through-holes to adjust the dielectric constant of the connector portion of the dielectric substrate.

According to another aspect of the invention, there is provided a through-hole structure comprising a dielectric substrate having a connector portion therein, the connector portion having a dielectric constant, a first through-hole positioned in the connector portion of the dielectric substrate, the first through-hole including a conductive layer therein for supplying a signal to the through-hole structure, a second through-hole positioned in the connector portion of the dielectric substrate relative to the first through-hole, the second through-hole including the conductive layer therein for supplying electrical power to the through-hole structure, and at least one dielectric constant adjusting portion positioned in the connector portion of the dielectric substrate between the first and second through-holes to adjust the dielectric constant of the connector portion of the dielectric substrate.

According to yet another aspect of the invention, there is provided a through-hole structure comprising a dielectric substrate having a connector portion therein, the connector portion having a dielectric constant, a first through-hole positioned in the connector portion of the dielectric substrate, the first through-hole including a conductive layer therein for supplying a signal to the through-hole structure, a second through-hole positioned in the connector portion of the dielectric substrate relative to the first through-hole, the second through-hole including the conductive layer therein for supplying electrical power to the through-hole structure, and at least one dielectric constant adjusting through-hole positioned in the connector portion of the dielectric substrate relative to the first and second through-holes to adjust the dielectric constant of the connector portion of the dielectric substrate.

According to still yet another aspect of the invention, there is provided a through-hole structure comprising a dielectric substrate having a connector portion therein, the connector portion having a dielectric constant, a first through-hole positioned in the connector portion of the dielectric substrate, the first through-hole including a conductive layer therein for supplying a signal to the through-hole structure, a second through-hole positioned in the connector portion of the dielectric substrate relative to the first through-hole, the second through-hole including the conductive layer therein for supplying electrical power to the through-hole structure, and at least one dielectric constant adjusting through-hole positioned in the connector portion of the dielectric substrate between the first and second through-holes to adjust the dielectric constant of the connector portion of the dielectric substrate.

According to another aspect of the invention, there is provided a through-hole structure comprising a dielectric substrate having a connector portion therein, the connector portion having a dielectric constant, a first through-hole positioned in the connector portion of the dielectric substrate, the first through-hole including a conductive layer therein for supplying a signal to the through-hole structure, a plurality of second through-holes positioned in the connector portion of the dielectric substrate relative to the first through-hole, each of the plurality of second through-holes including the conductive layer therein for supplying electrical power to the through-hole structure, and a plurality of dielectric constant adjusting portions centrosymmetrically positioned around the first though hole in the connector portion of the dielectric substrate relative to the plurality of the second through-holes to adjust the dielectric constant of the connector portion of the dielectric substrate.

According to yet another aspect of the invention, there is provided a through-hole structure comprising a dielectric substrate having a connector portion therein, the connector portion having a dielectric constant, a first through-hole positioned in the connector portion of the dielectric substrate, the first through-hole including a conductive layer therein for supplying a signal to the through-hole structure, a plurality of second through-holes positioned in the connector portion of the dielectric substrate relative to the first through-hole, each the plurality of second through-holes including the conductive layer therein for supplying electrical power to the through-hole structure, and a plurality of dielectric constant adjusting portions asymmetrically positioned around the first though hole in the connector portion of the dielectric substrate relative to the plurality of the second through-holes to adjust the dielectric constant of the connector portion of the dielectric substrate.

According to still yet another aspect of the invention, there is provided a printed circuit board comprising a dielectric substrate having a connector portion therein, a through-hole structure in the connector portion for connecting a connector to the printed circuit board, a first through-hole positioned in the through-hole structure, the first through-hole including a conductive layer therein for supplying a signal to the printed circuit board, a second through-hole positioned in the through-hole structure relative to the first through-hole, the second through-hole including the conductive layer therein for supplying electrical power to the printed circuit board, and at least one dielectric constant adjusting portion positioned in the through-hole structure relative to the first and second through-holes to substantially prevent impedance mismatch between the printed circuit board and the connector.

According to another aspect of the invention, there is provided a printed circuit board comprising a dielectric substrate having a connector portion therein, a through-hole structure in the connector portion for connecting a connector to the printed circuit board, a first through-hole positioned in the through-hole structure, the first through-hole including a conductive layer therein for supplying a signal to the printed circuit board, a second through-hole positioned in the through-hole structure relative to the first through-hole, the second through-hole including the conductive layer therein for supplying electrical power to the printed circuit board, and at least one dielectric constant adjusting portion positioned in the through-hole structure between the first and second through-holes to substantially prevent impedance mismatch between the printed circuit board and connector.

According to yet another aspect of the invention, there is provided a printed circuit board comprising a dielectric substrate having a connector portion therein, a through-hole structure in the connector portion for connecting a connector to the printed circuit board, a first through-hole positioned in the through-hole structure, the first through-hole including a conductive layer therein for supplying a signal to the printed circuit board, a second through-hole positioned in the through-hole structure relative to the first through-hole, the second through-hole including the conductive layer therein for supplying electrical power to the printed circuit board, and at least one dielectric constant adjusting through-hole positioned in the through-hole structure relative to the first and second through-holes to substantially prevent impedance mismatch between the printed circuit board and the connector.

According to still yet another aspect of the invention, there is provided a printed circuit board comprising a dielectric substrate having a connector portion therein, a through-hole structure in the connector portion for connecting a connector to the printed circuit board, a first through-hole positioned in the through-hole structure, the first through-hole including a conductive layer therein for supplying a signal to the printed circuit board, a second through-hole positioned in the through-hole structure relative to the first through-hole, the second through-hole including the conductive layer therein for supplying electrical power to the printed circuit board, and at least one dielectric constant adjusting through-hole positioned in the through-hole structure between the first and second through-holes to substantially prevent impedance mismatch between the printed circuit board and the connector.

According to another aspect of the invention, there is provided a printed circuit board comprising a dielectric substrate having a connector portion therein, a through-hole structure in the connector portion for connecting a connector to the printed circuit board, a first through-hole positioned in the through-hole structure, the first through-hole including a conductive layer therein for supplying a signal to the printed circuit board, a plurality of second through-holes positioned in the through-hole structure relative to the first through-hole, each of the plurality of second through-holes including the conductive layer therein for supplying electrical power to the printed circuit board, and a plurality of dielectric constant adjusting portions centrosymmetrically positioned around the first through-hole in the through-hole structure relative to the plurality of second through-holes to substantially prevent impedance mismatch between the printed circuit board and the connector.

According to yet another aspect of the invention, there is provided a printed circuit board comprising a dielectric substrate having a connector portion therein, a through-hole structure in the connector portion for connecting a connector to the printed circuit board, a first through-hole positioned in the through-hole structure, the first through-hole including a conductive layer therein for supplying a signal to the printed circuit board, a plurality of second through-holes positioned in the through-hole structure relative to the first through-hole, each of the plurality of second through-holes including the conductive layer therein for supplying electrical power to the printed circuit board, and a plurality of dielectric constant adjusting portions asymmetrically positioned around the first through-hole in the through-hole structure relative to the plurality of second through-holes to substantially prevent impedance mismatch between the printed circuit board and the connector.

DETAILED DESCRIPTION OF THE PREFERRED EMBODIMENTS

For more complete understanding of the present invention and the advantages thereof, reference is now made to the following description taken in conjunction with the above-described drawings.

Figure 1:
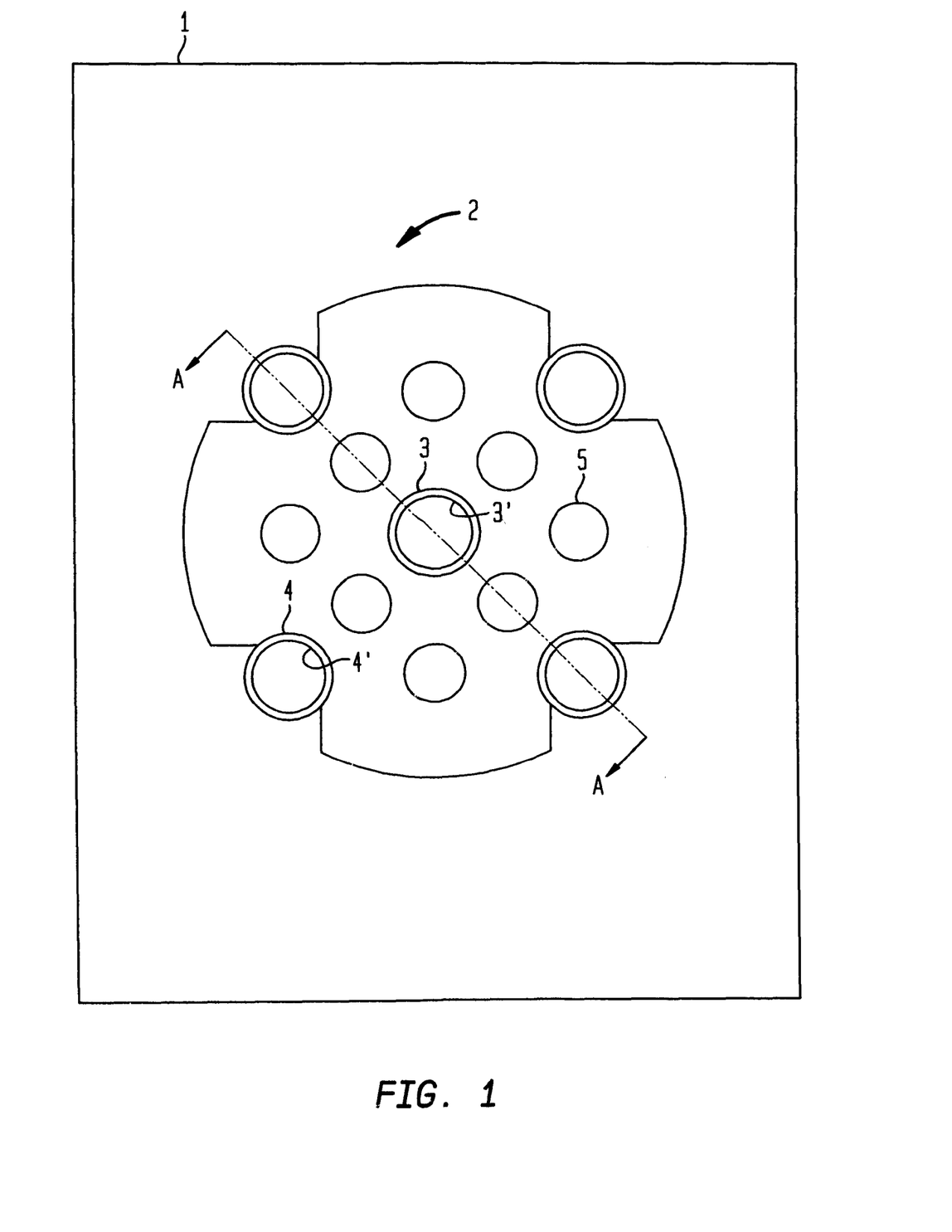
FIG. 1 is a top plan view showing an embodiment of a through-hole structure of the present invention.

FIG. 1 is a top plan view showing a through-hole structure 2 formed in a printed circuit board 1 according to the present invention. The through-hole structure 2 of the present invention comprises: a signal through-hole 3 provided in the center portion of the through-hole structure 2, signal through-hole 3 being treated by a surface conducting treatment (a conductive layer) forming a connector 3' for a signal so as to transmit the signal therethrough; power through-holes 4 formed so as to surround a periphery of signal through-hole 3, power through-holes 4 including a surface conducting treatment (a conductive layer) forming a connector 4'; and a plurality of dielectric constant adjusting portions 5 formed between signal through-hole 3 and power through-holes 4. The conducting treatments for signal through-hole 3 and power through-holes 4 can be formed by plating a conductive layer, respectively 3', 4' on the inner surface of the through holes. Signal through hole 3 and power through holes 4 can then be defined as plated through holes.

As shown in FIG. 1, the plurality of dielectric constant adjusting portions 5 are formed in the space of the printed circuit board between signal through-hole 3 and power through-holes 4 so as to surround the signal through-hole. The plurality of dielectric constant adjusting portions 5 are provided to adjust an impedance characteristic of a high-frequency signal path in through-hole structure 2 of the present invention. In the present invention, "high frequency" implies a frequency ranging, for example, from about 0.8 Gigahertz (GHz) to about 30 GHz. A typical example of a high-frequency connector is an surface mount attach (SMA) connector, among others.

The plurality of dielectric constant adjusting portions 5 for use in the present invention can be configured by various methods. For example, in the embodiment shown in FIG. 1, the plurality of dielectric constant adjusting portions 5 are comprised of non-conductive through-holes. The insides of the dielectric constant adjusting portions 5 thus configured are filled with air (relative dielectric constant=1). Thus, an average relative dielectric constant between signal through-hole 3 and the power through-holes 4 is lowered from the average relative dielectric constant of a printed circuit board typically formed of a dielectric such as an epoxy resin (relative dielectric constant of about 4).

In general, in the case where through-holes are used as the plurality of dielectric constant adjusting portions 5, the impedance or capacitance of the junction portion between the connector and the printed circuit board varies depending on the diameter and number of through-holes, the dielectric constant of the dielectric material in the through-holes and placement position of the through-holes. When the diameter of the through-holes is increased, the impedance can be increased. When the number of the through-holes is increased, the impedance can be increased as well. Moreover, with regard to the dielectric constant of the dielectric material in the through-holes, the lower the dielectric constant, the higher the impedance becomes, and vice versa. Furthermore, with regard to the position of through-holes, when the plurality of dielectric constant through-holes 5 are provided on a straight line that connects the centers of signal through-hole 3 and power through-holes 4, the impedance can be adjusted to a great extent. Still further, since an uniform electromagnetic field is formed for transmitting high-frequency signals, it is important that the plurality of dielectric constant adjusting portions 5 are arranged centrosymmetrically with signal through-hole 3 at the center.

The insides of the dielectric constant adjusting portions 5 of the present invention, that is, the through-holes formed to adjust the dielectric constant, can be filled with inorganic or organic ferroelectric material, for example, barium titanate, lead zirconium titanate (PZT) and polyvinylidene fluoride (PVDF). In this case, the average relative dielectric constant in the region of through-hole structure 2 can be increased more than the relative dielectric constant of the epoxy resin around the through-hole structure, thus enabling an impedance match.

Figure 2:
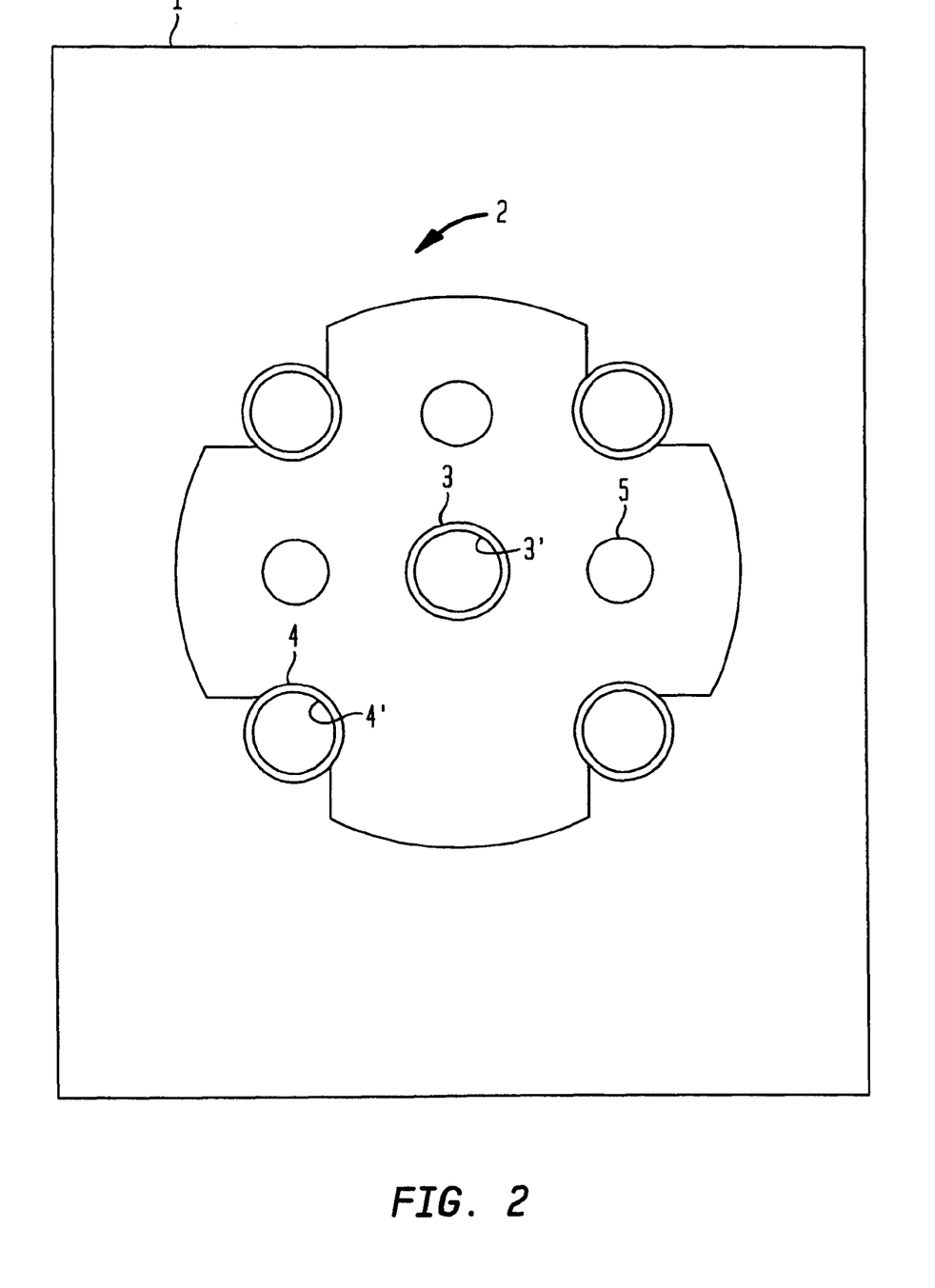
FIG. 2 is a top plan view showing another embodiment of the through-hole structure of the present invention.

FIG. 2 is a top plan view showing another embodiment of through-hole structure 2 of the present invention. In this embodiment, the above-described plurality of dielectric constant adjusting portions 5 are arranged not to be centrosymmetrical, but to be asymmetrical in the space between signal through-hole 3 and power through-holes 4. In the present invention, the above-described plurality of dielectric constant adjusting portions 5 can be formed in any number and arrangement in order to reduce the impedance mismatch in the region of through-hole structure 2, particularly at high frequency.

In the case where the above-described plurality of dielectric constant adjusting portions 5 are through-holes, the diameter of the through-holes can be set to about 300 micrometers. However, the diameters of these through-holes can be designed appropriately. Moreover, with regard to dielectric constant adjusting through holes, the impedance depends on the diameter and arrangement of the through-holes, the relative dielectric constant of the dielectric inside the through holes, and the structure and the material of printed circuit board 1. In the case where through-hole structure 2 of the present invention is provided as a high-frequency connector portion, the impedance can be appropriately set to range from about 35 ohm to about 70 ohm.

Figure 3:
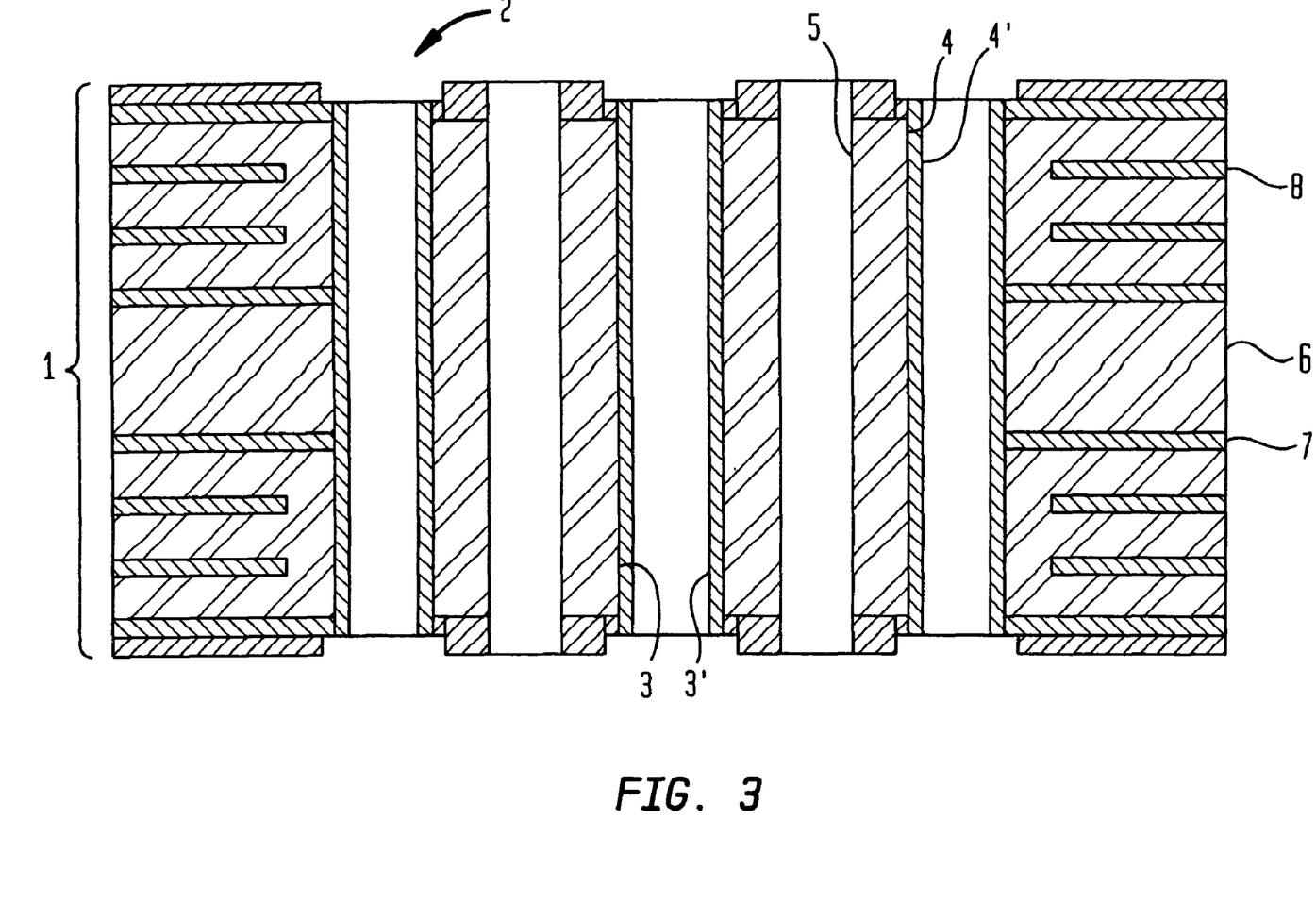
FIG. 3 is a sectional view in elevation of a much enlarged portion of a printed circuit board including the through-hole structure of the present invention.

FIG. 3 is a much enlarged sectional view in elevation of printed circuit board 1 of the present invention (sectioned along an arrow line A—A of FIG. 1) in the region where through-hole structure 2 of the present invention is formed. The through-hole structure 2 of the present invention can be a multi-layered substrate including dielectric layer 6 comprising an epoxy resin or the like. Inside dielectric layer 6, power wiring 7 for supplying power to the power through-hole, and signal wiring 8 for transmitting electric signals to the signal through-hole and the like are formed. The through-hole structure 2, which extends vertically, penetrates printed circuit board 1.

The power through-hole 4 is formed as a conductive through-hole, and dielectric constant adjusting portion 5 is formed as a non-conductive through-hole filled with air. Moreover, signal through-hole 3, through which the high-frequency signal is transmitted, is formed in the center portion of through-hole structure 2. FIG. 3 illustrates the centrosymmetrical arrangement of signal through-hole 3, power through-holes 4 and the plurality of dielectric constant adjusting portions 5. As previously described, any arrangement of dielectric constant adjusting portions 5 can be adopted as long as the impedance mismatch is reduced.

Figure 4:
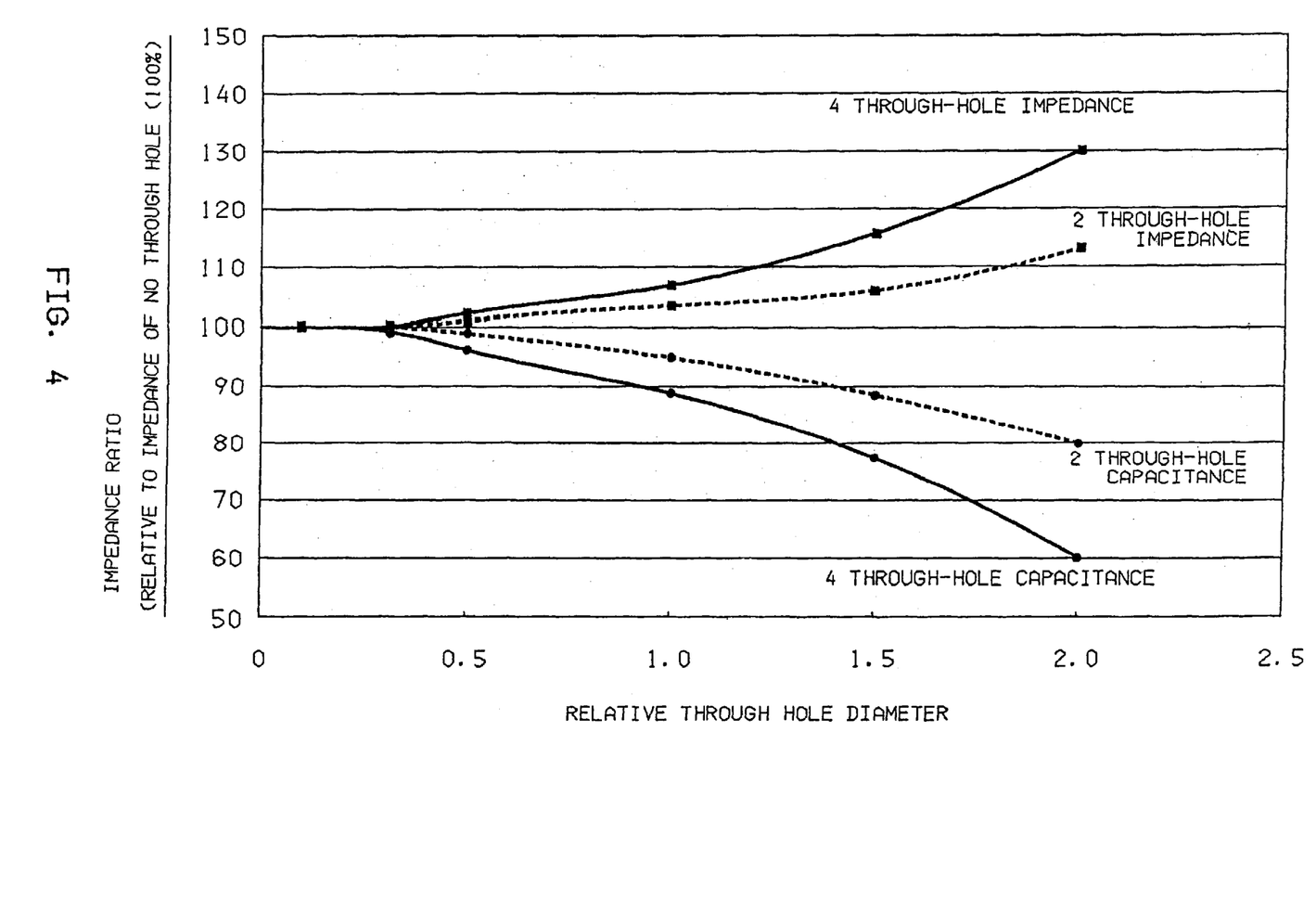
FIG. 4 is a graph showing results of a simulation on variations of impedance and capacitance to a relative through-hole diameter.

FIG. 4 is a graph showing results of a simulation on the extent of the impedance adjustment possible by the use of the through-hole structure of the present invention. The abscissa of the graph represents varying relative diameters of through-holes used as the plurality of dielectric constant adjusting portions 5. The relative through-hole diameter is defined as the ratio between the diameter of a variable through-hole and the predetermined diameter of another through-hole. The ordinate of the graph represents fluctuations of the impedance and the capacitance that are obtained by the through-hole structure of the present invention when each of the impedance and the capacitance of the conventional through-hole structure, having no through-holes for adjusting the dielectric constant formed therein, is set to 100%.

Figure 5:
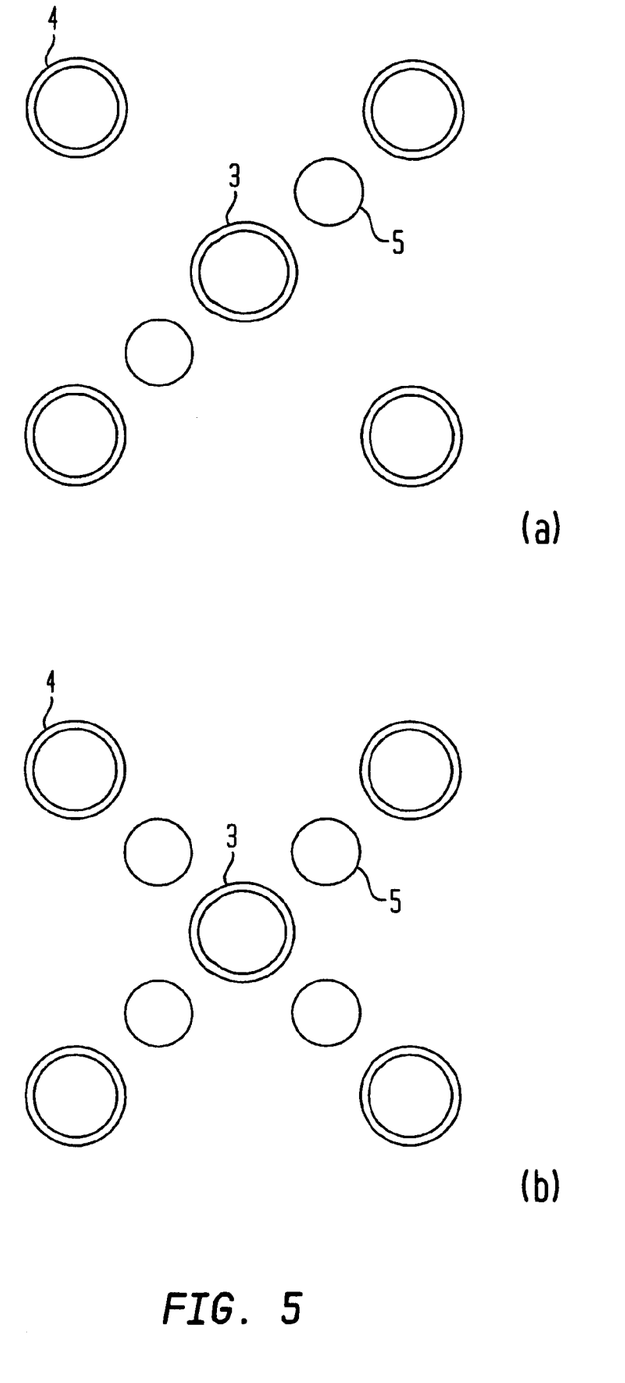
FIGS. 5(a) and 5(b) are views showing the through-hole structures used in the simulation shown in FIG. 4.

Note that the simulation was performed for two types of dielectric constant adjusting through-hole structures: a through-hole structure having two through-holes for adjusting the dielectric constant arranged therein; and the other through-hole structure having four through-holes for adjusting the dielectric constant arranged therein. The simulation was performed on the assumption that the inside of the through-holes for adjusting the dielectric constant was filled with air. FIGS. 5(a) and 5(b) show the through-hole structures used for the simulation. FIG. 5(a) shows the through-hole structure of the present invention, in which the two through-holes are arranged as dielectric constant adjusting portions 5, and FIG. 5(b) shows the through-hole structure of the present invention, in which the four through-holes are arranged as dielectric constant adjusting portions 5.

Referring to FIG. 4, it is understood that the impedance and the capacitance can be consecutively adjusted by varying the relative dielectric constant adjusting through-hole diameter. Therefore, it is understood that the adjustment of the impedance and the capacitance can be performed more readily with higher accuracy than before according to the present invention.

Figure 6:
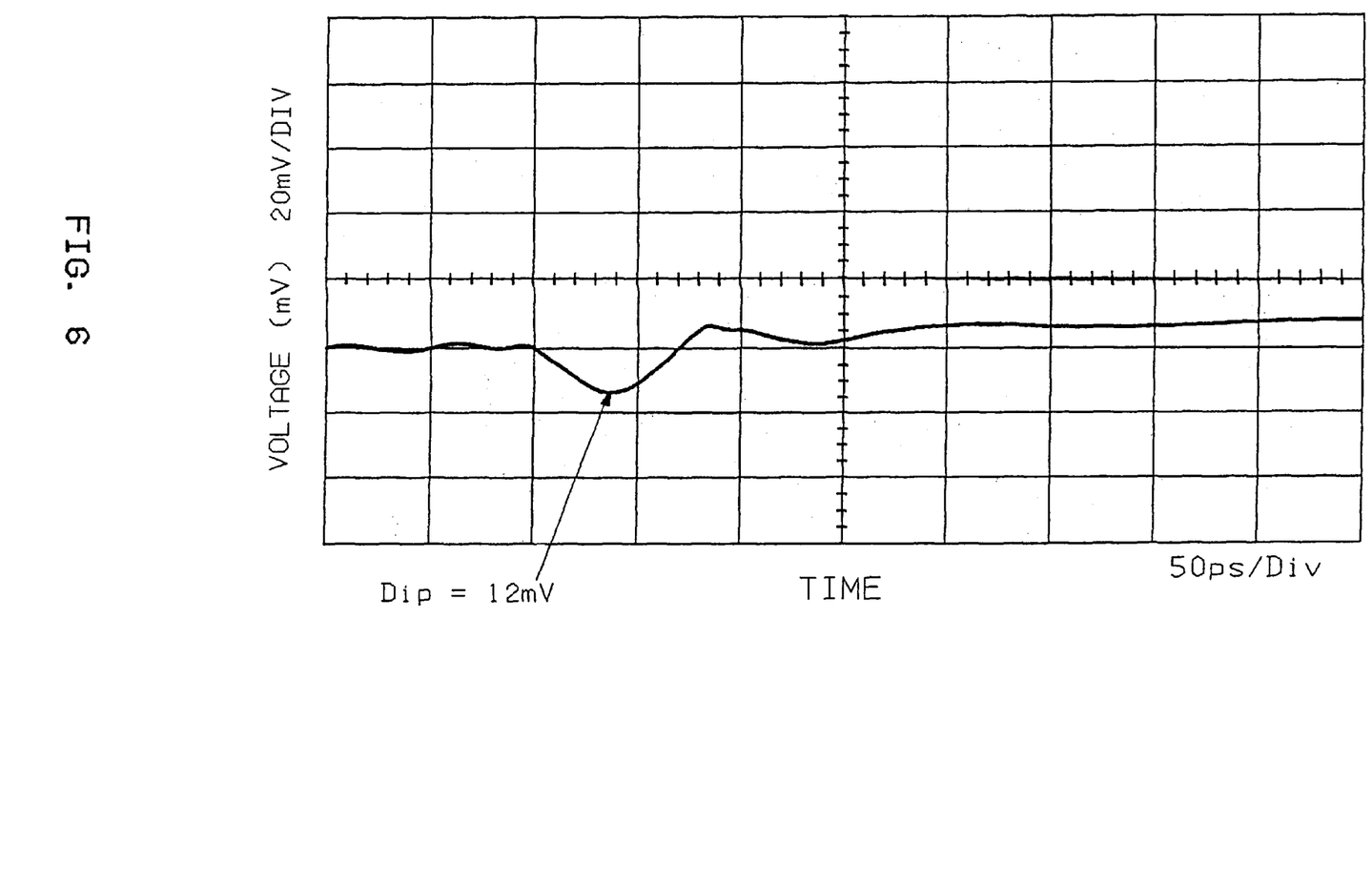
FIG. 6 is a graph showing a transient characteristic of reflection of a high-frequency connector formed in the printed circuit board of the present invention.

FIG. 6 is a graph showing a transient characteristic of reflection, brought about by inputting a high-frequency signal into printed circuit board 1 having through-hole structure 2 of the present invention as shown in FIG. 2. In FIG. 6, the ordinate thereof represents a voltage (mV: 1 Div.=20 mV, where mV is a millivolt), and the abscissa thereof represents time (ps: 1 Div.=50 ps, where ps is a picosecond). In this embodiment, the through-holes formed as the plurality of dielectric constant adjusting portions 5 are set asymmetrically. However, similar effects can be obtained by arranging the plurality of dielectric constant through holes centrosymmetrically. As an input signal, a signal with input voltage $V_i$=200 mV and rise time $T_r$=50 ps, was used. As shown in FIG. 6, the reflection in the high-frequency connector portion of through-hole structure 2 of the present invention forms a dip of about 12 mV. Moreover, it is shown that the amplitude in the voltage variation caused by the reflection after the formation of the dip is small.

Figure 7:
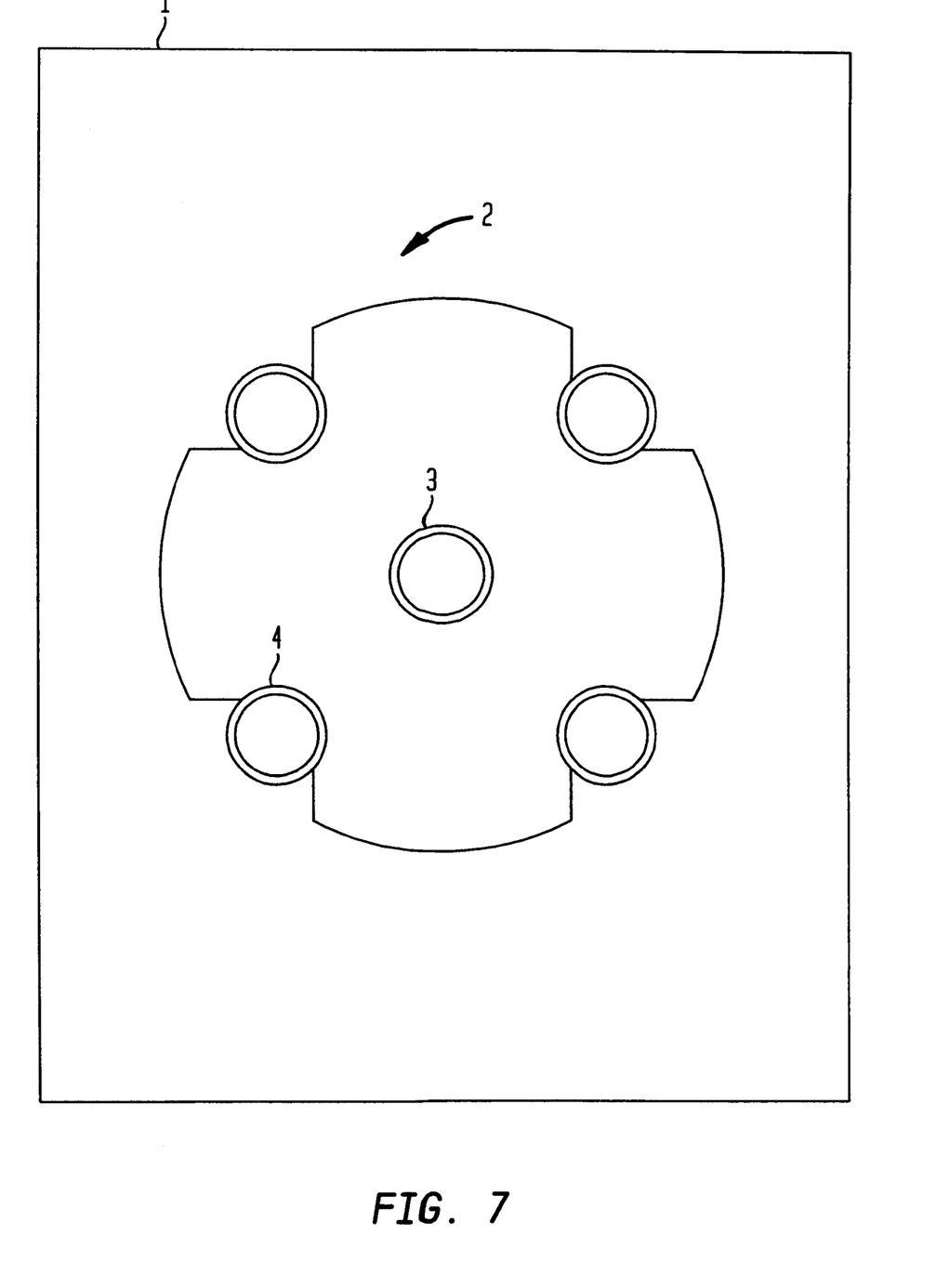
FIG. 7 is a top plan view of a high-frequency connector portion having through-holes without dielectric constant adjusting portions.
Figure 8:
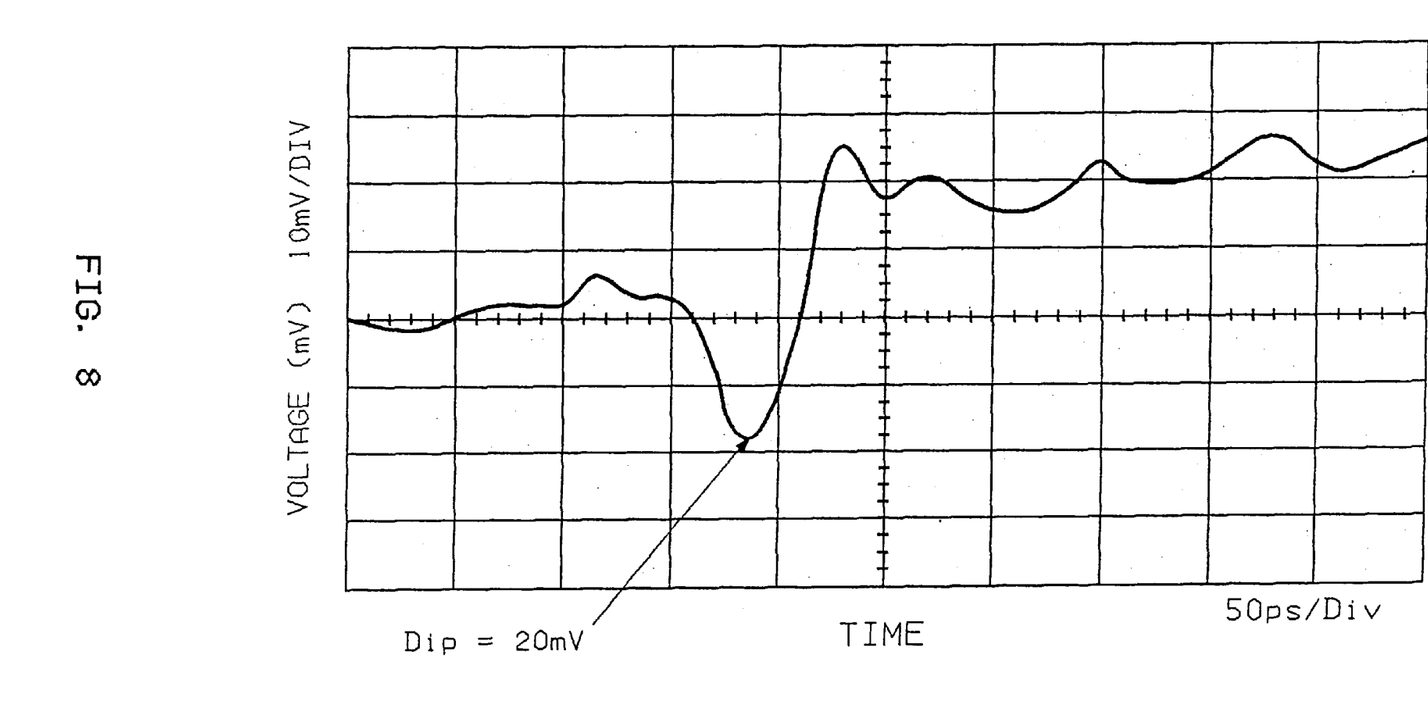
FIG. 8 is a graph showing the transient characteristic of reflection in the high-frequency connector portion of FIG. 7.

For the purpose of comparison, another printed circuit board is configured as shown in FIG. 7 in such a manner that the high-frequency connector portion lacks through-holes for adjusting dielectric constant. The transient characteristic thereof to the same input signal was examined. FIG. 8 shows a transient reflection characteristic to the input signal obtained in the case of using the through-hole structure shown in FIG. 7. In FIG. 8, the ordinate thereof represents voltage (mV: 1 Div.=10 mV), and the abscissa thereof represents time (ps: 1 Div.=50 ps).

FIG. 8 shows that a dip of some 20 mV in response to the input signal formed in the high-frequency connector using the through-hole structure without dielectric constant adjusting portions 5. Moreover, in FIG. 8, it is understood that the amplitude of the voltage after the formation of the dip is larger in comparison with the high-frequency connector with the through-hole structure according to the embodiment of the present invention shown in FIG. 6. Accordingly, it is understood that the through-hole structure when part of the printed circuit board of the present invention realizes impedance matching in the through-hole structure location. Consequently, it is possible to reduce the reflection and to decrease the voltage variation after the reflection.

The description made for the present invention is based on the embodiments with reference to the drawings. However, the present invention is not limited to the embodiments shown in the drawings. Even if any configuration that has been heretofore known is adopted with regard to shape, arrangement and number of the dielectric constant adjusting portions, the type and material of the printed circuit board (including a buildup printed circuit board and a copper-foiled printed circuit board), and the like, the present invention is applicable as long as the effects of the present invention are obtained.

While there have been shown and described what are the present considered preferred embodiments of the invention, it will be obvious to those skilled in the art that various changes and modifications may be made therein without departing from the scope of the invention as defined by the appended claims.

What is claimed is:

1. A through-hole structure comprising:
   a dielectric substrate having a connector portion therein, the connector portion having a dielectric constant;
   a first through-hole positioned in said connector portion of said dielectric substrate, said first through-hole including a conductive layer therein for supplying a signal to said through-hole structure;
   a second through-hole positioned in said connector portion of said dielectric substrate, spaced relative to said first through-hole, said second through-hole including a conductive layer therein for supplying electrical power to said through-hole structure; and
   at least one dielectric constant adjusting nonconductive portion positioned in said connector portion of said dielectric substrate, spaced relative to said first and second through-holes to adjust said dielectric constant of said connector portion of said dielectric substrate.

2. The through-hole structure of claim 1, further including a connector positioned in said first and second through-holes of said dielectric substrate.

3. The through-hole structure of claim 2, wherein said connector comprises a high-frequency connector.

4. A through-hole structure comprising:
   a dielectric substrate having a connector portion therein, the connector portion having a dielectric constant;
   a first through-hole positioned in said connector portion of said dielectric substrate, said first through-hole including a conductive layer therein for supplying a signal to said through-hole structure;

a second through-hole positioned in said connector portion of said dielectric substrate, spaced relative to said first through-hole, said second through-hole including a conductive layer therein for supplying electrical power to said through-hole structure; and at least one dielectric constant adjusting nonconductive portion positioned in said connector portion of said dielectric substrate between said first and second through-holes to adjust said dielectric constant of said connector portion of said dielectric substrate.

5. The through-hole structure of claim 4, further including a connector positioned in said first and second through-holes of said dielectric substrate.

6. The through-hole structure of claim 5, wherein said connector comprises a high-frequency connector.

7. A through-hole structure comprising:

a dielectric substrate having a connector portion therein, the connector portion having a dielectric constant;

a first through-hole positioned in said connector portion of said dielectric substrate, said first through-hole including a conductive layer therein for supplying a signal to said through-hole structure;

a second through-hole positioned in said connector portion of said dielectric substrate, spaced relative to said first through-hole, said second through-hole including a conductive layer therein for supplying electrical power to said through-hole structure; and at least one dielectric constant adjusting nonconductive through-hole positioned in said connector portion of said dielectric substrate, spaced relative to said first and second through-holes to adjust said dielectric constant of said connector portion of said dielectric substrate.

8. The through-hole structure of claim 7, further including a connector positioned in said first and second through-holes of said dielectric substrate.

9. The through-hole structure of claim 8, wherein said connector comprises a high-frequency connector.

10. A through-hole structure comprising:

a dielectric substrate having a connector portion therein, said connector portion having a dielectric constant;

a first through-hole positioned in said connector portion of said dielectric substrate, said first through-hole including a conductive layer therein for supplying a signal to said through-hole structure;

a second through-hole positioned in said connector portion of said dielectric substrate, spaced relative to said first through-hole, said second through-hole including a conductive layer therein for supplying electrical power to said through-hole structure; and at least one dielectric constant adjusting nonconductive through-hole positioned in said connector portion of said dielectric substrate between said first and second through-holes to adjust said dielectric constant of said connector portion of said dielectric substrate.

11. The through-hole structure of claim 10, further including a connector positioned in said first and second through-holes of said dielectric substrate.

12. The through-hole structure of claim 11, wherein said connector comprises a high-frequency connector.

13. A through-hole structure comprising:

a dielectric substrate having a connector portion therein, said connector portion having a dielectric constant;

a first through-hole positioned in said connector portion of said dielectric substrate, said first through-hole including a conductive layer therein for supplying a signal to said through-hole structure;

a plurality of second through-holes positioned in said connector portion of said dielectric substrate, spaced relative to said first through-hole, each of said plurality of second through-holes including a conductive layer therein for supplying electrical power to said through-hole structure; and a plurality of dielectric constant adjusting nonconductive portions centrosymmetrically positioned around said first though hole in said connector portion of said dielectric substrate relative to said plurality of said second through-holes to adjust said dielectric constant of said connector portion of said dielectric substrate.

14. The through-hole structure of claim 13, further including a connector positioned in said first and second through-holes of said dielectric substrate.

15. The through-hole structure of claim 14, wherein said connector comprises a high-frequency connector.

16. A through-hole structure comprising:

a dielectric substrate having a connector portion therein, said connector portion having a dielectric constant;

a first through-hole positioned in said connector portion of said dielectric substrate, said first through-hole including a conductive layer therein for supplying a signal to said through-hole structure;

a plurality of second through-holes positioned in said connector portion of said dielectric substrate, spaced relative to said first through-hole, each said plurality of second through-holes including a conductive layer therein for supplying electrical power to said through-hole structure; and a plurality of dielectric constant adjusting nonconductive portions asymmetrically positioned around said first though hole in said connector portion of said dielectric substrate relative to said plurality of said second through-holes to adjust said dielectric constant of said connector portion of said dielectric substrate.

17. The through-hole structure of claim 16, further including a connector positioned in said first and second through-holes of said dielectric substrate.

18. The through-hole structure of claim 17, wherein said connector comprises a high-frequency connector.

19. A printed circuit board comprising:

a dielectric substrate having a connector portion therein;

a through-hole structure in said connector portion for connecting a connector to said printed circuit board;

a first through-hole positioned in said through-hole structure, said first through-hole including a conductive layer therein for supplying a signal to said printed circuit board;

a second through-hole positioned in said through-hole structure, spaced relative to said first through-hole, said second through-hole including a conductive layer therein for supplying electrical power to said printed circuit board; and at least one dielectric constant adjusting nonconductive portion positioned in said through-hole structure, spaced relative to said first and second through-holes to substantially prevent impedance mismatch between said printed circuit board and said connector.

20. The printed circuit board of claim 19, wherein said connector comprises a high-frequency connector.

21. A printed circuit board comprising:

a dielectric substrate having a connector portion therein;

a through-hole structure in said connector portion for connecting a connector to said printed circuit board;

a first through-hole positioned in said through-hole structure, said first through-hole including a conductive layer therein for supplying a signal to said printed circuit board;

a second through-hole positioned in said through-hole structure, spaced relative to said first through-hole, said second through-hole including a conductive layer therein for supplying electrical power to said printed circuit board; and at least one dielectric constant adjusting nonconductive portion positioned in said through-hole structure between said first and second through-holes to substantially prevent impedance mismatch between said printed circuit board and said connector.

22. The printed circuit board of claim 21, wherein said connector comprises a high-frequency connector.

23. A printed circuit board comprising:

a dielectric substrate having a connector portion therein;

a through-hole structure in said connector portion for connecting a connector to said printed circuit board;

a first through-hole positioned in said through-hole structure, said first through-hole including a conductive layer therein for supplying a signal to said printed circuit board;

a second through-hole positioned in said through-hole structure, spaced relative to said first through-hole, said second through-hole including a conductive layer therein for supplying electrical power to said printed circuit board; and at least one dielectric constant adjusting nonconductive through-hole positioned in said through-hole structure, spaced relative to said first and second through-holes to substantially prevent impedance mismatch between said printed circuit board and said connector.

24. The printed circuit board of claim 23, wherein said connector comprises a high-frequency connector.

25. A printed circuit board comprising:

a dielectric substrate having a connector portion therein;

a through-hole structure in said connector portion for connecting a connector to said printed circuit board;

a first through-hole positioned in said through-hole structure, said first through-hole including a conductive layer therein for supplying a signal to said printed circuit board;

a second through-hole positioned in said through-hole structure, spaced relative to said first through-hole, said second through-hole including a conductive layer therein for supplying electrical power to said printed circuit board; and at least one dielectric constant adjusting nonconductive through-hole positioned in said through-hole structure, spaced between said first and second through-holes to substantially prevent impedance mismatch between said printed circuit board and said connector.

26. The printed circuit board of claim 25, wherein said connector comprises a high-frequency connector.

27. A printed circuit board comprising:

a dielectric substrate having a connector portion therein;

a through-hole structure in said connector portion for connecting a connector to said printed circuit board;

a first through-hole positioned in said through-hole structure, said first through-hole including a conductive layer therein for supplying a signal to said printed circuit board;

a plurality of second through-holes positioned in said through-hole structure, spaced relative to said first through-hole, each of said plurality of second through-holes including a conductive layer therein for supplying electrical power to said printed circuit board; and a plurality of dielectric constant adjusting nonconductive portions centrosymmetrically positioned around said first through-hole in said through-hole structure relative to said plurality of second through-holes to substantially prevent impedance mismatch between said printed circuit board and said connector.

28. The printed circuit board of claim 27, wherein said connector comprises a high-frequency connector.

29. A printed circuit board comprising:

a dielectric substrate having a connector portion therein;

a through-hole structure in said connector portion for connecting a connector to said printed circuit board;

a first through-hole positioned in said through-hole structure, said first through-hole including a conductive layer therein for supplying a signal to said printed circuit board;

a plurality of second through-holes positioned in said through-hole structure, spaced relative to said first through-hole, each of said plurality of second through-holes including a conductive layer therein for supplying electrical power to said printed circuit board; and a plurality of dielectric constant adjusting nonconductive portions asymmetrically positioned around said first through-hole in said through-hole structure, spaced relative to said plurality of second through-holes to substantially prevent impedance mismatch between said printed circuit board and said connector.

30. The printed circuit board of claim 29, wherein said connector comprises a high-frequency connector.

* * * * *